(12) United States Patent
Atamny et al.

(10) Patent No.: US 10,734,268 B1
(45) Date of Patent: Aug. 4, 2020

(54) MODULARITY OF TEC-CELL, FOUP AND SUBSTRATE CONTAINERS AND CARRIERS

(71) Applicant: MURATA MACHINERY, LTD., Kyoto-Fu (JP)

(72) Inventors: Fachri Atamny, Richterswil (CH); Gerhard Dovids, Grabs (CH); Yves Fenner, Berg (CH)

(73) Assignee: MURATA MACHINERY, LTD., Kyoto (JP)

(\*) Notice: Subject to any disclaimer, the term of this patent is extended or adjusted under 35 U.S.C. 154(b) by 0 days.

(21) Appl. No.: 16/117,278

(22) Filed: Aug. 30, 2018

Related U.S. Application Data

(60) Provisional application No. 62/551,891, filed on Aug. 30, 2017.

(51) Int. Cl.
| | |
|---|---|
| *H01L 21/677* | (2006.01) |
| *H01L 21/673* | (2006.01) |
| *H01L 21/687* | (2006.01) |
| *G05B 19/418* | (2006.01) |
| *B65G 1/14* | (2006.01) |

(52) U.S. Cl.
CPC .. *H01L 21/67769* (2013.01); *G05B 19/41815* (2013.01); *H01L 21/67386* (2013.01); *H01L 21/68707* (2013.01); *B65G 1/14* (2013.01); *G05B 2219/31216* (2013.01); *G05B 2219/45031* (2013.01); *H01L 21/67781* (2013.01)

(58) Field of Classification Search
CPC ......... H01L 21/67769; H01L 21/68707; H01L 21/67781; H01L 21/67386; G05B 19/41815; G05B 2219/31216; G05B 2219/45031
See application file for complete search history.

(56) References Cited

U.S. PATENT DOCUMENTS

| | | | | |
|---|---|---|---|---|
| 8,337,134 | B2 * | 12/2012 | Greber | H01L 21/67781 |
| | | | | 414/331.17 |
| 9,728,436 | B2 * | 8/2017 | Tabrizi | H01L 21/67294 |
| 10,081,494 | B2 * | 9/2018 | Yoshioka | B65G 35/00 |
| 10,395,960 | B2 * | 8/2019 | Dovids | B65G 37/005 |
| 2004/0170003 | A1 * | 9/2004 | Chen | H01L 21/67363 |
| | | | | 361/741 |
| 2008/0298935 | A1 * | 12/2008 | Lering | H01L 21/67383 |
| | | | | 414/217.1 |
| 2009/0087289 | A1 * | 4/2009 | Osada | H01L 21/67386 |
| | | | | 414/223.01 |
| 2017/0186638 | A1 * | 6/2017 | Chen | H01L 21/67386 |

(Continued)

*Primary Examiner* — Kaitlin S Joerger
(74) *Attorney, Agent, or Firm* — Keating & Bennett, LLP

(57) ABSTRACT

Methods, systems and apparatuses for an improved wafer and substrate carrier or container with improved modularity. More specifically, to a carrier or container with improved abilities which may provide high or low density carriers or containers with improved interchanging and compatibility, including for Tec-Cells, FOUPs, and other third party containers, carriers, modules, rings or any other systems, structures, apparatuses, or methods associated. The invention may provided an ability to interchange or be cross-compatible such as wherein Tec-Cell carriers, containers, rings or modules may be provided to be housed in a FOUP or other third party carrier or wherein substrates or wafers held in the Tec-Cell Carriers, rings, containers, or modules, and then held within the FOUP.

19 Claims, 12 Drawing Sheets

(56) References Cited

U.S. PATENT DOCUMENTS

| 2018/0122674 A1* | 5/2018 | Dovids | H01L 21/67386 |
| 2018/0122675 A1* | 5/2018 | Dovids | H01L 21/67766 |
| 2018/0134491 A1* | 5/2018 | Dovids | B65G 1/137 |
| 2018/0169720 A1* | 6/2018 | Dovids | B65G 1/00 |

* cited by examiner

MODULARITY OF TEC-CELL, FOUP AND SUBSTRATE CONTAINERS AND CARRIERS

This application claims priority from U.S. Provisional Patent Application Ser. No. 62/551,891, filed on Aug. 30, 2017, entitled Modularity of Tec-Cell, FOUP and Substrate Containers and Carriers which applications are incorporated herein by reference in their entirety for all purposes.

FIELD OF TECHNOLOGY

This disclosure relates generally to handling substrates and wafers. In one example embodiment, to an improved wafer and substrate carrier or container system, method or apparatus. More specifically, to a carrier or container with improved abilities which may provide high or low density carriers or containers with improved interchanging and compatibility.

BACKGROUND

Within many fields, substrates and wafers must be processed, stored and otherwise moved within a factory, assembly line, or system. Since the introduction of the 300 mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they may be clamped in place by fins and held for later use. Yet FOUPs today may be hampered by methods and system designs which may contaminate their contents, chafe wafers, and delay loading and unloading of substrate wafer contents as a result of multifarious construction. Thus, there may be a need for an invention that more efficiently and accurately accomplishes the desired tasks of FOUPs.

Additionally, FOUPs may be hampered by their design in that they cannot hold wafers at a reasonably high density. Manufacturing and processing require that wafers and substrates be provided in high numbers, through small areas and footprints to many locations or aspects in a system. With higher density carrier or containers, faster and more efficient production can be made. Additionally, FOUPs lack many features aiding in cleanliness, efficiency and contamination reduction, as well as other aspects, and do not provide for space saving or high density holding or carrying of wafers and substrates. As such FOUPs then may be inefficient and unable to provide for the needs of today's substrate and wafer manufacturing and processing.

With the above considerations, the Tec-Cell carriers and systems provide an improved ability for substrate and wafer processing, transportation, storage, handling, among other abilities. However, legacy and third party systems will still be used and available throughout the future. As such, compatibility of Tec-Cell carriers, containers, and features and all systems, apparatuses and methods, with legacy and third party products are desired to provide full feature of use for Tec-Cells in today's substrate and wafer facilities. Thus, there is a need for high density-able and cross-compatible features within Tec-Cell products to be used within low-density and legacy systems, apparatuses and methods.

SUMMARY

Disclosed are methods, apparatus, and systems that provide to an improved wafer and substrate carrier or container system, method or apparatus. More specifically, to a carrier or container with improved abilities which may provide high or low density carriers or containers with improved interchanging and compatibility.

The present invention may provide a system wherein Tec-Cells, FOUPs, and other third party containers, carriers, modules, rings or any other systems, structures, apparatuses, or methods associated, may be provided an ability to interchange, be cross-compatible or otherwise be used.

The present invention may provide wherein the Tec-Cell carriers, containers, rings or modules may be provided to be housed in a FOUP or other third party carrier.

This may include wherein substrates or wafers held in the Tec-Cell Carriers, rings, containers, or modules, and then held within the FOUP, such as for instance substrates or wafers held on Tec-Cell carriers, stacked in a Tec-Cell container, and then placed in a FOUP.

In a preferred embodiments, substrates or wafers are held stacked in Tec-Cell carriers, which are then held in FOUPs. It is noted that the system may rely on the isolation properties of the Tec-Cell carriers or containers or the FOUPs. This may allow then the ability for isolation at any level and structure.

The present invention, may provide then interchangeability with FOUPs and Tec-Cell carriers, even with different sized substrates, wafers, Tec-Cell carriers, modules, rings or containers, and FOUPs and other third part containers wherein the pieces may interchangeably be designed to be housed or fit within another.

The present invention, may provide wherein the substrates or wafers, Tec-Cell carriers, modules, rings or containers, and FOUPs and other third part container, may be accessible via robot, or any other handling or transportation mechanism, and wherein additionally, the Tec-Cell containers, carriers, and modules, along with possibly the substrates or wafers held, may be interchanged between high density closed positions and low density opened positions such that interchangeability and accessing may be allowed.

The methods and systems disclosed herein may be implemented in any means for achieving various aspects. Other features will be apparent from the accompanying drawings and from the detailed description that follows.

BRIEF DESCRIPTION OF THE DRAWINGS

Example embodiments are illustrated by way of example and are not limited to the figures of the accompanying drawings, in which, like references indicate similar elements.

Figure 1:
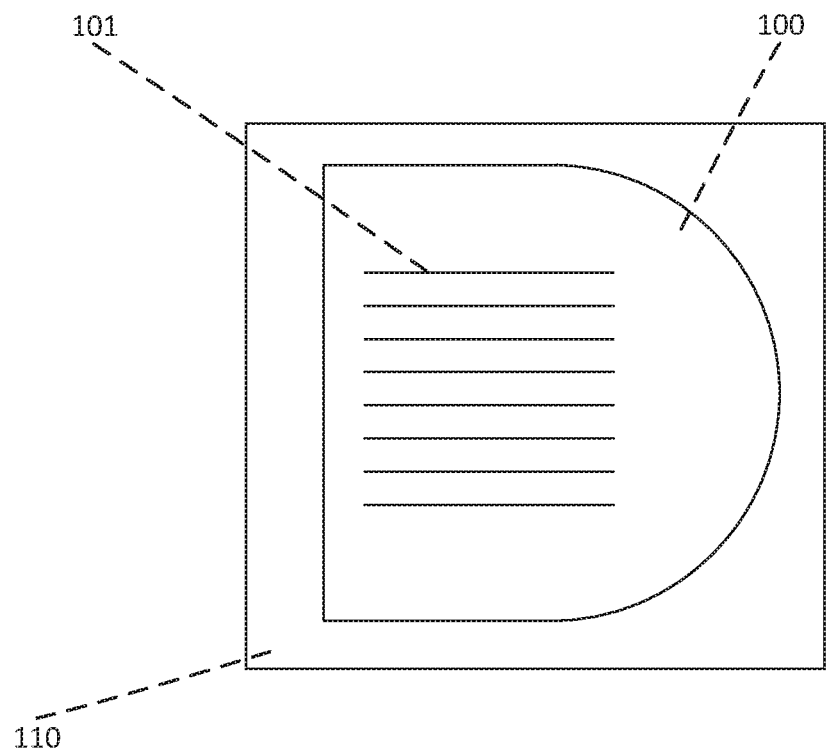
FIG. 1 is a component diagram of an embodiment of the present invention providing interchangeability between Tec-Cell structures and third party structures and systems.

Other features of the present embodiments will be apparent from the accompanying drawings and from the detailed description that follows.

DETAILED DESCRIPTION

Disclosed are methods, apparatus, and systems that may provide improved modularity and cross-compatibility of Tec-Cell, FOUP and substrate carriers In some embodiments, which may be combined with any other embodiment, the present invention may provide improved cross compatibility and modularity for low density containers or carriers, as well as all associated systems, methods and apparatuses.

In some embodiments, which may be combined with any other embodiment, the present invention may provide improved cross compatibility and modularity for high density containers or carriers, as well as all associated systems, methods and apparatuses.

In some embodiments, which may be combined with any other embodiment, the present invention may provide wherein the Tec-Cell container can be configured inside of a low-density container wherein the Tec-Cell container is self-contained or isolated from the low density container and ambient.

In some embodiments, which may be combined with any other embodiment, the present invention may provide wherein the Tec-Cell carrier can be configured inside of a low-density container wherein the Tec-Cell carrier is self-contained or isolated from the low density container and ambient.

In some embodiments, which may be combined with any other embodiment, the present invention may provide wherein the Tec-Cell container can be configured inside of a low-density container wherein the low density container is self-contained or isolated from the ambient, such that the Tec-Cell container is isolated from the ambient or exterior of the low density container, but wherein is not necessarily isolated or completely isolated from the interior of the low density container.

In some embodiments, which may be combined with any other embodiment, the present invention may provide wherein the Tec-Cell carrier can be configured inside of a low-density container wherein the low density container is self-contained or isolated from the ambient, such that the Tec-Cell carrier is isolated from the ambient or exterior of the low density container, but wherein is not necessarily isolated or completely isolated from the interior of the low density container.

In some embodiments, which may be combined with any other embodiment, the present invention may provide wherein the before mentioned and latter mentioned low density carriers are FOUPs or other legacy or third party containers, stations, systems or apparatuses.

In some embodiments, which may be combined with any other embodiment, the present invention may provide wherein the Tec-Cell carrier can be configured of a low-density container wherein the low density container is self-contained or isolated from the ambient, such the inside of a FOUP can be self-contained with some, all or none of the Tec-Cells being isolated from each other.

In some embodiments, which may be combined with any other embodiment, the present invention may provide wherein to reduce contamination they may be self-contained or even inside of a FOUP when the Tec-Cell carriers, modules or container are apart.

In some embodiments, which may be combined with any other embodiment, the present invention may provide wherein to reduce contamination they may be self-contained or even inside of a FOUP when the Tec-Cell carriers, modules or container are together, such that the membranes, seals or otherwise isolating systems are connected or disconnected, or sealed or unsealed.

In some embodiments, which may be combined with any other embodiment, the present invention may provide wherein to reduce contamination they may be self-contained or even inside of a FOUP when some, none or all of the Tec-Cell carriers, modules or container are together, such that the membranes, seals or otherwise isolating systems are connected or disconnected, or sealed or unsealed.

In some embodiments, which may be combined with any other embodiment, the present invention may provide wherein since the Tec-Cell carriers, modules or containers are provided simple rings, as aforementioned in previous applications, therein the system may be cheap. Easy and elementary to replace either in situ within the storage, processing or other system or structure, or via removal, or another access by the user, robot or automated system, such as ex-situ or via recall, or other transport mechanisms, which may be proprietary or universal to other systems and needs of the system.

In some embodiments, which may be combined with any other embodiment, the present invention may provide wherein since the Tec-Cell carriers, modules or containers are provided simple rings, as aforementioned in previous applications, therein the system may be cheap to replace.

In some embodiments, which may be combined with any other embodiment, the present invention may provide wherein since the Tec-Cell carriers, modules or containers since are provided in larger container, may be provided ease of replacement, less failure mode, or be provided other advantages such as because the carriers, containers or modules are within a FOUP or other container, failure mode and breakage is lessened due to relying on the FOUP or larger container isolation or other properties.

In some embodiments, which may be combined with any other embodiment, the present invention may provide wherein since the Tec-Cell carriers, modules or containers since are provided in larger container, may be provided ease of replacement, less failure mode, or be provided other advantages such as because the carriers, containers or modules are within a FOUP or other container, failure mode and breakage is lessened due to relying the FOUP or larger container relying on the systems and isolation or other properties of the TEC-Cell carriers, containers and modules.

In some embodiments, which may be combined with any other embodiment, the present invention may provide since the Tec-Cell carrier, containers, modules or rings may self-isolated, particle generation may be mitigated or the mechanical self may produce low contamination because the rings create little chaffing.

In some embodiments, which may be combined with any other embodiment, the present invention may provide wherein a stack of Tec-Cell carriers may fit inside one or more FOUPs.

In some embodiments, which may be combined with any other embodiment, the present invention may provide wherein a stack of Tec-Cell carriers in a container may fit inside one or more FOUPs.

In some embodiments, which may be combined with any other embodiment, the present invention may provide wherein a stack of Tec-Cell carriers in multiple containers may fit inside one or more FOUPs.

In some embodiments, which may be combined with any other embodiment, the present invention may provide wherein multiple Tec-Cell carriers in one or more containers may fit inside a FOUPs.

In some embodiments, which may be combined with any other embodiment, the present invention may provide wherein multiple Tec-Cell carriers may fit inside a FOUPs.

It is noted that the aforementioned and latter mentioned carriers, containers, etc., may include substrates or wafers being held.

In some embodiments, which may be combined with any other embodiment, the present invention may provide wherein 2 or more Tec-Cell carriers, containers or modules of for instance 25 each, may fit inside a FOUP wherein a total of 50 are within for instance since use half of pitch.

In some embodiments, which may be combined with any other embodiment, the present invention may provide wherein 4 or more Tec-Cell carriers, containers or modules of for instance 25 each, may fit inside a FOUP wherein a total of 100 are within for instance since use the full pitch.

In some embodiments, which may be combined with any other embodiment, the present invention may provide wherein there may be multi-wafer sizes in the Tec-Cell carriers, containers or modules.

In some embodiments, which may be combined with any other embodiment, the present invention may provide wherein there may be multi-wafer sizes in the Tec-Cell carriers, containers or modules such as for single batches or types.

In some embodiments, which may be combined with any other embodiment, the present invention may provide wherein there may be multi-wafer sizes in the Tec-Cell carriers, containers or modules such as for multi type batches or types.

In some embodiments, which may be combined with any other embodiment, the present invention may provide wherein there may be multi-wafer sizes in the Tec-Cell carriers, containers or modules such as for single batches or types, wherein the Tec-Cell carriers, containers or modules fit in a FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types may be organized to a container, module, system, or for instance a FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types may be organized to a particular FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types of a substrate, of which may dictate a type of size for a Tec-Cell carrier, container module, may be organized to a container, module, system, or for instance a FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types of a substrate, of which may dictate a type of size for a Tec-Cell carrier, container module, wherein the sizes or types may be organized to a particular FOUP It is noted, in the above embodiments, and in any other embodiment, the substrate may or may not dictate the size of the Tec-Cell carrier, container or module, as the Tec-Cell containers, carriers, or modules, depending on the embodiment, may be size dependent or be universal, or fit multiple sizes.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types may be separated to a container, module, system, or for instance FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types may be separated to a particular FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types of a substrate, of which may dictate a type of size for a Tec-Cell carrier, container module, may be separated to a container, module, system, or for instance a FOUP.

In some embodiments, which may be combined with any other embodiment, the present invention may provide wherein there may be multi-wafer sizes in the Tec-Cell carriers, containers or modules such as for multi type batches or types, wherein the Tec-Cell carriers, containers or modules fit in a FOUP, wherein the sizes or types of a substrate, of which may dictate a type of size for a Tec-Cell carrier, container module, wherein the sizes or types may be separated to a particular a FOUP.

In some embodiments, which may be combined with any other embodiment, the present invention may provide wherein the Tec-Cell carriers, containers or modules can be accessed in a larger container by a robot.

In some embodiments, which may be combined with any other embodiment, the present invention may provide wherein the Tec-Cell carriers, containers or modules can be accessed in FOUP by a robot.

In some embodiments, which may be combined with any other embodiment, the present invention may provide wherein the Tec-Cell carriers, containers or modules can be accessed in larger container by a transport system, handling or other system, apparatus or method, in any plurality, such as multiple robots, or transport systems.

In some embodiments, which may be combined with any other embodiment, the present invention may provide wherein the Tec-Cell carriers, containers or modules can be accessed in larger container by a transport system, handling or other system such as an OHT system.

In some embodiments, which may be combined with any other embodiment, the present invention may provide wherein the Tec-Cell carriers, containers or modules can be accessed in a FOUP by a transport system.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell containers, carriers, or modules are forced from a closed configuration to an open configuration, such as to be accessed within the larger container such as a FOUP.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell containers, carriers, or modules are forced from a closed configuration to an open configuration, such as to be accessed to be brought out of a larger container such as a FOUP.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell containers, carriers, or modules are removed from the larger container, such as a FOUP and forced from a closed configuration to an open configuration, such as to be accessed individually, as a group stack, or any other plurality.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell containers, carriers, or modules are forced from an open configuration to an closed configuration, such as to be kept within the larger container such as a FOUP.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell containers, carriers, or modules are forced from an open configuration to a closed configuration, such as to be accessed to be kept in a larger container such as a FOUP.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell forced from an open configuration to a closed configuration, such as to be accessed individually, as a group stack, or any other plurality and containers, carriers, or modules and placed into the larger container, such as a FOUP.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein via a spring force.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein via a spring force, wherein the spring force may provide wherein the Tec-Cell containers, carriers, or modules are forced from a closed configuration to an open configuration.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as wherein the Tec-Cell containers, carriers, or modules are forced from a closed configuration to an open configuration.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as the robot, or system having an opener or closer function, or both.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as the robot, or system having an opener or closer function, or both, such as the robot having an effector, or more than one effector.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as the robot, or system having an opener or closer function, or both, such as the robot having at least one effector, wherein the effector is able to provide cross compatibility.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as the robot, or system with or without at least one effector, having an opener or closer function, or both, such as the robot having at least one effector, wherein the effector is able to provide cross compatibility, such as to open or close the configuration of high or low density Tec-Cell carriers, containers or modules.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as the robot, or system with or without at least one effector, having an opener or closer function, or both, such as the robot having at least one effector, wherein the effector is able to provide cross compatibility, such as to access different sizes of Tec-Cell carriers, containers or modules.

In some embodiments, which may be combined with any other embodiment, the present invention may provide wherein the Tec-Cell carriers, containers or modules can be accessed in larger container by a transport system, handling or other system, apparatus or method, wherein the robot, actuator, or any plurality of systems may be provided such as the robot, or system with or without at least one effector, having ability to access or manipulate both the larger container such as a FOUP and the Tec-Cell containers, carriers or modules.

In a preferred embodiment, the present invention may provide a substrate manufacturing, processing or transfer system, wherein includes at least: a loading sub-system, wherein the system is configured with: a load port, wherein the load port. This may then configure to transfer one or more elements to and from one or more exterior systems and one or more interior sub-systems, wherein the port partially or completely isolates the interior of the system from the ambient environment. It is noted that the elements may be one or more holders, wherein the holders hold one or more substrates and wherein the load port can accept Tec-Cell or third party substrates, holders or containers without reconfiguration, such that the load port is actively configurable to accept any size or type.

In some preferred embodiments, the present invention may provide wherein the system additionally accepts one or more containers, wherein the containers hold the one or more holders with one or more substrates in a stack. Additionally, the system may provide wherein the holder is a Tec-Cell holder, wherein the holders are stackable, have one or more holding arms that extend into a center interior recess of the holder such that that the holder holds a substrate via the holding arms, hold one substrate each, such that there is a separation between each substrate when the holders are stacked and are formed from one piece. In some embodiments, the holder may be a third party substrate holder.

It is noted that in one or more holders may be stacked in a container, which may be a Tec-Cell container, wherein the holders can be configured in a low or high density configuration, or in other embodiment the container may be a FOUP.

In some preferred embodiments, the present invention may provide wherein the load port includes a handshake sub-system that transfers substrates to and from Tec-Cell holders and third party holder or wherein the load port includes a handshake sub-system that transfers Tec-Cell carriers to and from Tec-Cell containers and third party containers including FOUPs. It is noted that the load port may otherwise include a handshake sub-system that transfers third party carriers to and from Tec-Cell containers and third-party containers including FOUPs or wherein the load port includes a handshake sub-system that configures the Tec-Cell container with holders and substrates to or from a high and low density configuration.

Additionally the load port may ready at least one of the substrates, holders or containers to be accessed by a transport sub-system.

In some preferred embodiments, the present invention may provide the handshake sub-system readies the holders and substrates to be accessed in batches, or groups. It is noted that the batches or groups may be determined by the type of holder or substrate or wherein the handshake sub-system readies the holders or substrates to be accessed in batches, or groups depending on the type of container.

It is noted that the system may then have a load port that is OHT accessible and includes one or more effectors to manipulate the substrates, holders, and containers. This includes wherein the effector may be a robot arm or wherein each effector may be configured for a particular type of substrate holder or container.

Additionally, each effector may be actively configurable effector end such that each effector can manipulate any type of substrate, holder or container.

It is noted that the elements mentioned may be reticles instead of substrates.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods are industry terms and may refer to similar alternatives In addition, the components shown in the figures, their connections, couples, and relationships, and their functions, are meant to be exemplary only, and are not meant to limit the embodiments described herein.

FIG. 1 is a component diagram of an embodiment of the present invention providing interchangeability between Tec-Cell structures and third party structures and systems.

FIG. 1 describes a system 110 wherein a third party container or larger container 100 such as a FOUP may house Tec-Cell carriers or rings 101 which may hold substrates or wafers, and wherein may be in low density or high density configuration.

Figure 2A:
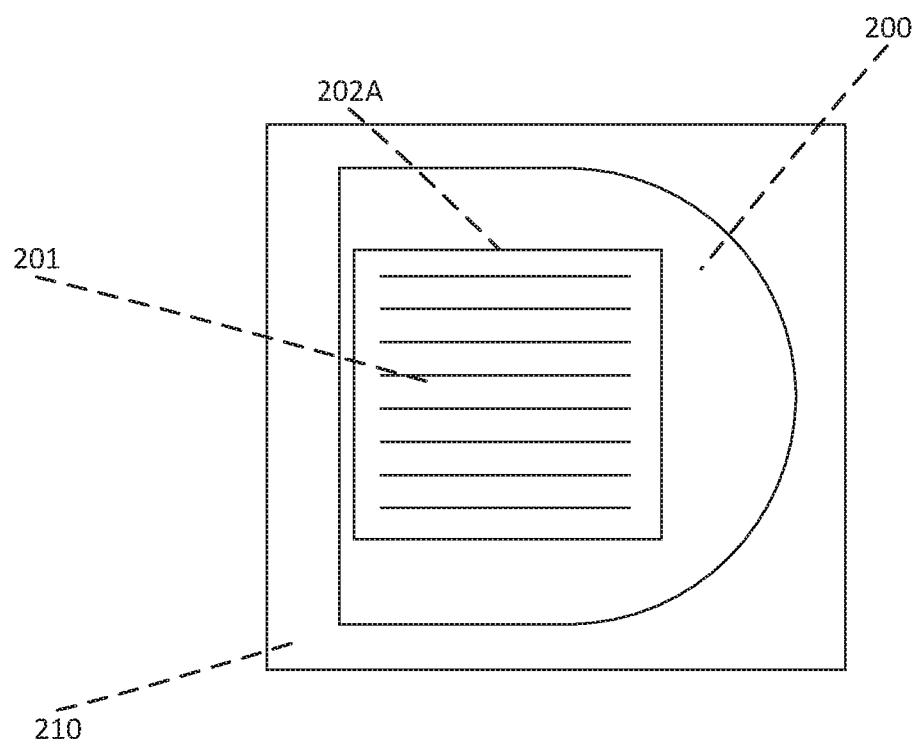
FIG. 2A is a component diagram of an embodiment of the present invention providing interchangeability between Tec-Cell structures and third party structures and systems.

FIG. 2A is a component diagram of an embodiment of the present invention providing interchangeability between Tec-Cell structures and third party structures and systems.

FIG. 2A describes a system 210 wherein a third party container or larger container 200 such as a FOUP may house a Tec-Cell container or structure 202A wherein Tec-Cell carriers or rings 201 which may hold substrates or wafers are inside, and wherein may be in low density or high density configuration.

Figure 2B:
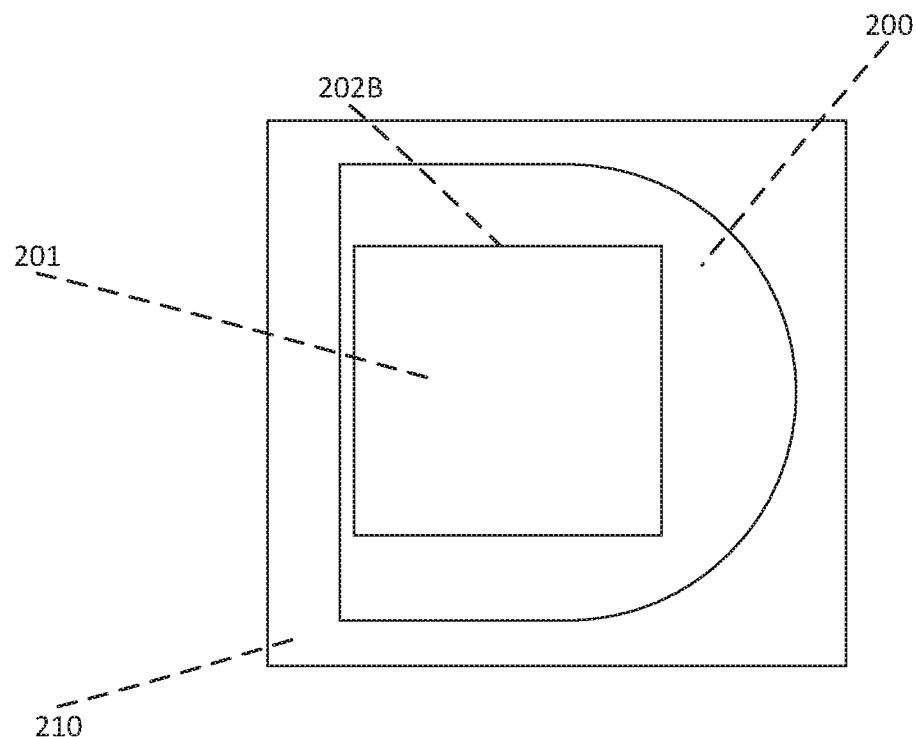
FIG. 2B is a component diagram of an embodiment of the present invention providing interchangeability between Tec-Cell structures and third party structures and systems.

FIG. 2B is a component diagram of an embodiment of the present invention providing interchangeability between Tec-Cell structures and third party structures and systems.

FIG. 2B describes a system 210 wherein a third party container or larger container 200 such as a FOUP may house a Tec-Cell container or structure 202B and wherein may be empty.

Figure 3A:
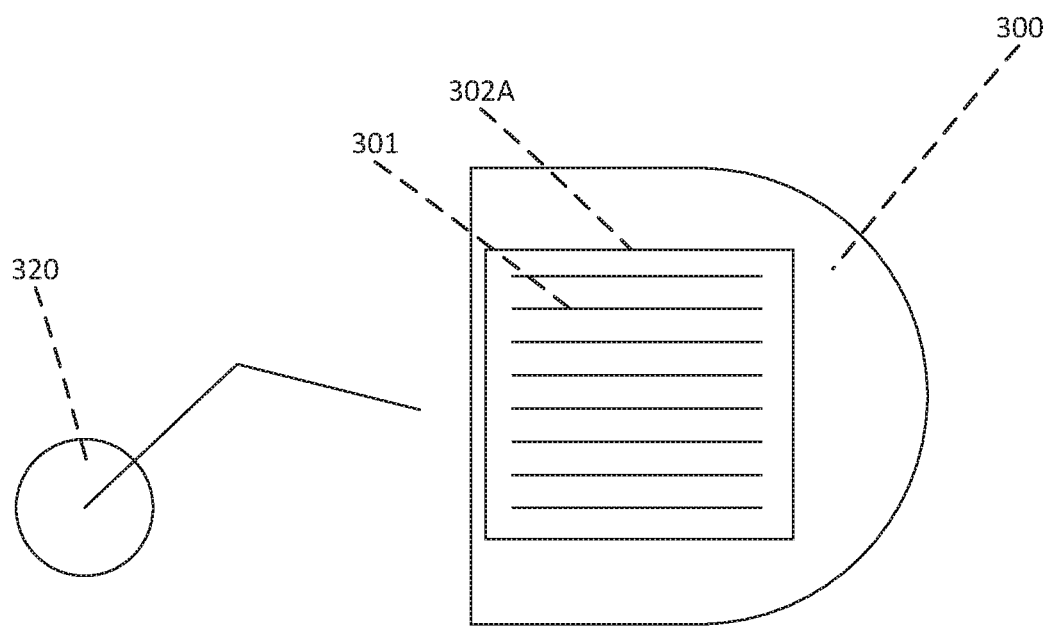
FIG. 3A is a component diagram of an embodiment of the present invention providing interchangeability between Tec-Cell structures and third party structures and systems.

FIG. 3A is a component diagram of an embodiment of the present invention providing interchangeability between Tec-Cell structures and third party structures and systems.

FIG. 3A describes a third party container or larger container 300 such as a FOUP of which may house a Tec-Cell container or structure 302A wherein Tec-Cell carriers or rings 301 which may hold substrates or wafers are inside, and wherein may be in low density or high density configuration, and wherein a robot or mechanism, such as a transport system 320 may be able to access, handle or effect the FOUP 300, container 302A, carriers 301, or wafers and substrates.

Figure 3B:
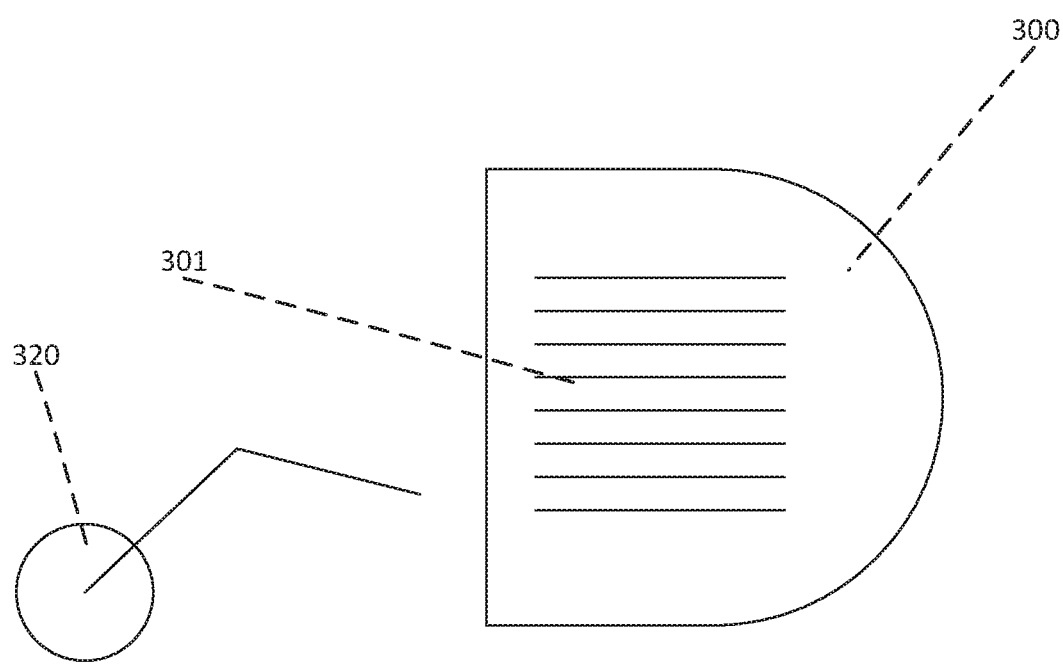
FIG. 3B is a component diagram of an embodiment of the present invention providing interchangeability between Tec-Cell structures and third party structures and systems.

FIG. 3B is a component diagram of an embodiment of the present invention providing interchangeability between Tec-Cell structures and third party structures and systems.

FIG. 3B describes a third party container or larger container 300 such as a FOUP of which may house Tec-Cell carriers or rings 301 which may hold substrates or wafers are inside, and wherein may be in low density or high density configuration, and wherein a robot or mechanism, such as a transport system 320 may be able to access, handle or effect the FOUP 300, carriers 301, or wafers and substrates.

Figure 4A:
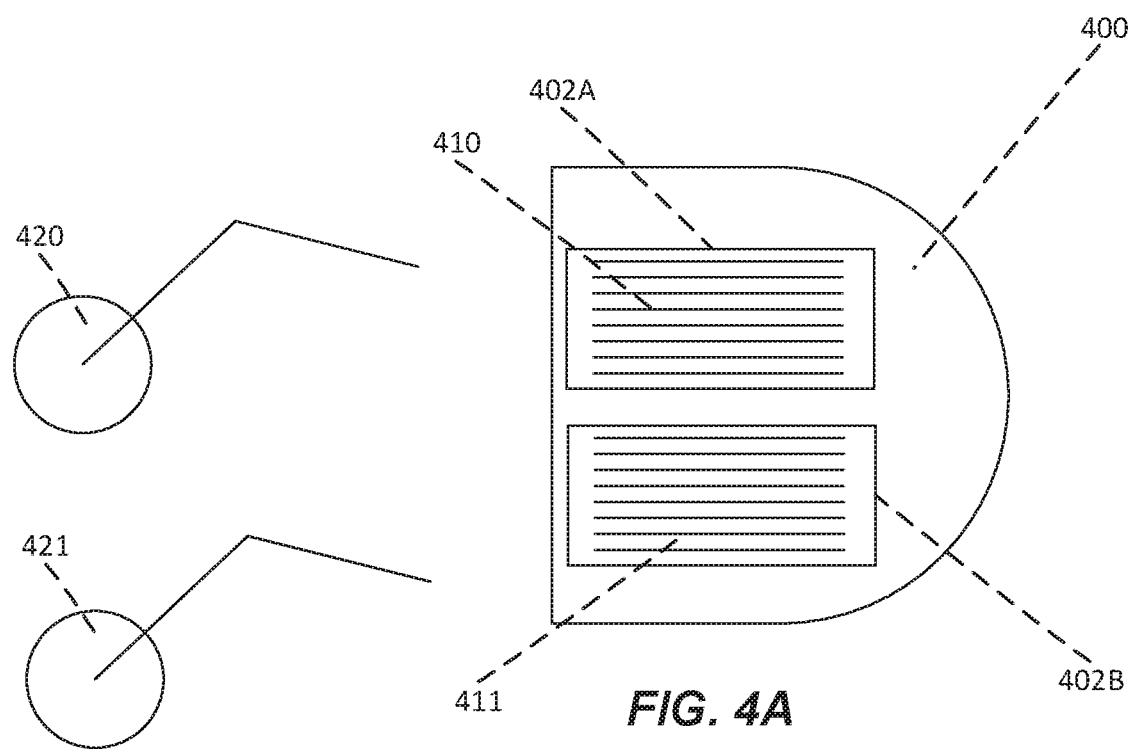
FIG. 4A is a component diagram of an embodiment of the present invention providing interchangeability between Tec-Cell structures and third party structures and systems.

FIG. 4A is a component diagram of an embodiment of the present invention providing interchangeability between Tec-Cell structures and third party structures and systems.

FIG. 4A describes a third party container or larger container 400 such as a FOUP of which may house a Tec-Cell container or structure 402A and any other plurality of containers or structures, such as Container 402B, wherein Tec-Cell carriers or rings 410 and 411 which may hold substrates or wafers are inside, and wherein may be in low density or high density configuration, and wherein a robot or mechanism, such as a transport system 420 and any plurality, such as an additional robot 421, may be able to access, handle or effect the FOUP 400, container 402A, carriers 401, or wafers and substrates.

Figure 4B:
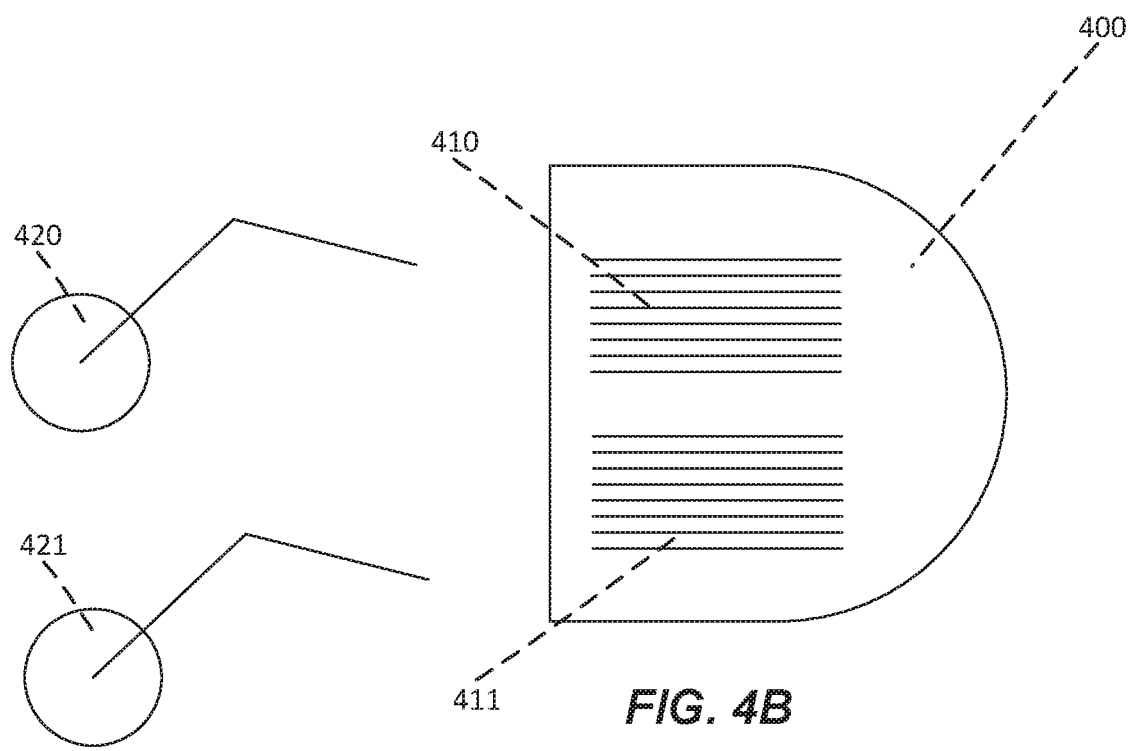
FIG. 4B is a component diagram of an embodiment of the present invention providing interchangeability between Tec-Cell structures and third party structures and systems.

FIG. 4B is a component diagram of an embodiment of the present invention providing interchangeability between Tec-Cell structures and third party structures and systems.

FIG. 4B describes a third party container or larger container 400 such as a FOUP wherein Tec-Cell carriers or rings may be in any plurality of stacks, groups or separations such as stack 410 and 411 which may hold substrates or wafers are inside, and wherein may be in low density or high density configuration, and wherein a robot or mechanism, such as a transport system 420 and any plurality, such as an additional robot 421, may be able to access, handle or effect the FOUP 400, container 402A, carriers 401, or wafers and substrates.

Figure 5A:
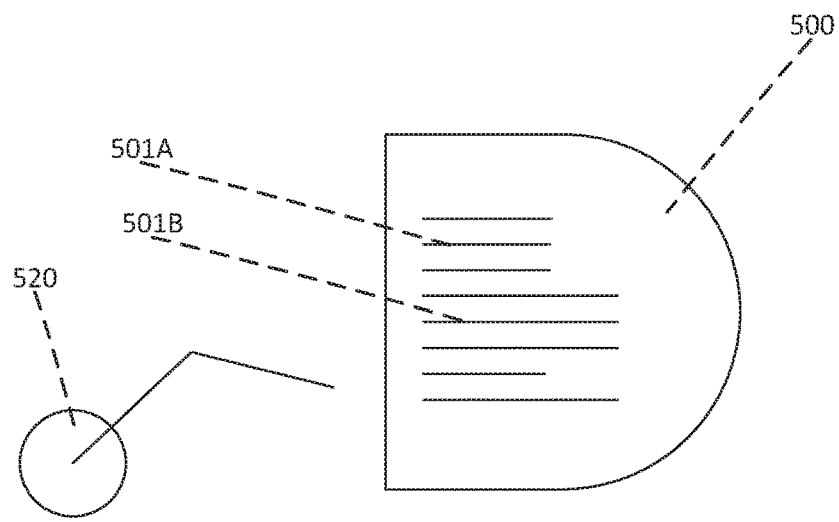
FIG. 5A is a component diagram of an embodiment of the present invention providing interchangeability between Tec-Cell structures and third party structures and systems.

FIG. 5A is a component diagram of an embodiment of the present invention providing interchangeability between Tec-Cell structures and third party structures and systems.

FIG. 5A describes a third party container or larger container 500 such as a FOUP of which wherein Tec-Cell carriers or rings may be of any size, shape, standard, etc. such as a size 501A and size 501B, wherein the sizes may be stacked, organized, disorganized or any other orientation or stacking and may be interlocking, or not interlocking even if the same size or different sizes, wherein in a preferred embodiment they are compatible. Additionally a robot 520, may be able to access, handle or effect the FOUP 500, carriers 501A and 501B, or wafers and substrates.

Figure 5B:
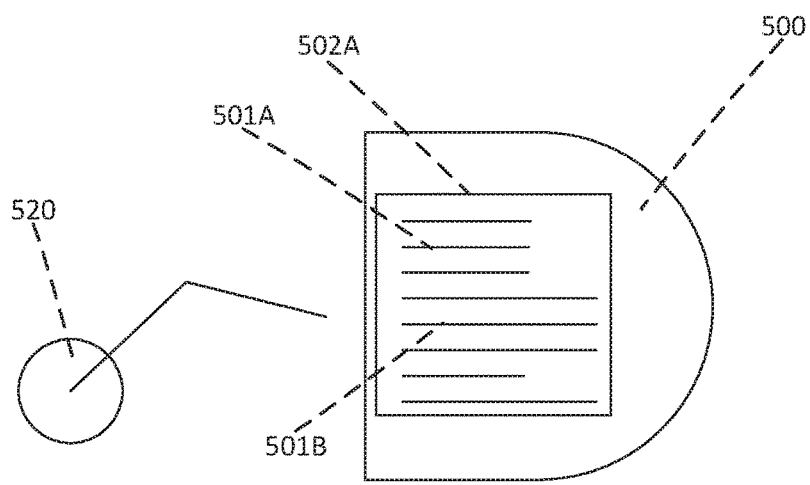
FIG. 5B is a component diagram of an embodiment of the present invention providing interchangeability between Tec-Cell structures and third party structures and systems.

FIG. 5B is a component diagram of an embodiment of the present invention providing interchangeability between Tec-Cell structures and third party structures and systems.

FIG. 5B describes a third party container or larger container 500 such as a FOUP of which therein is a container 502A wherein Tec-Cell carriers or rings may be of any size, shape, standard, etc. such as a size 501A and size 501B, wherein the sizes may be stacked, organized, disorganized or any other orientation or stacking and may be interlocking, or not interlocking even if the same size or different sizes, wherein in a preferred embodiment they are compatible. Additionally a robot 520, may be able to access, handle or effect the FOUP 500, carriers 501A and 501B, or wafers and substrates.

Figure 5C:
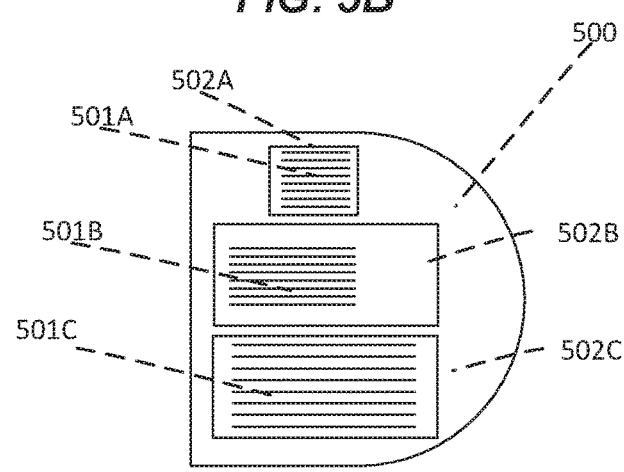
FIG. 5C is a component diagram of an embodiment of the present invention providing interchangeability between Tec-Cell structures and third party structures and systems.

FIG. 5C is a component diagram of an embodiment of the present invention providing interchangeability between Tec-Cell structures and third party structures and systems.

Figure 6A:
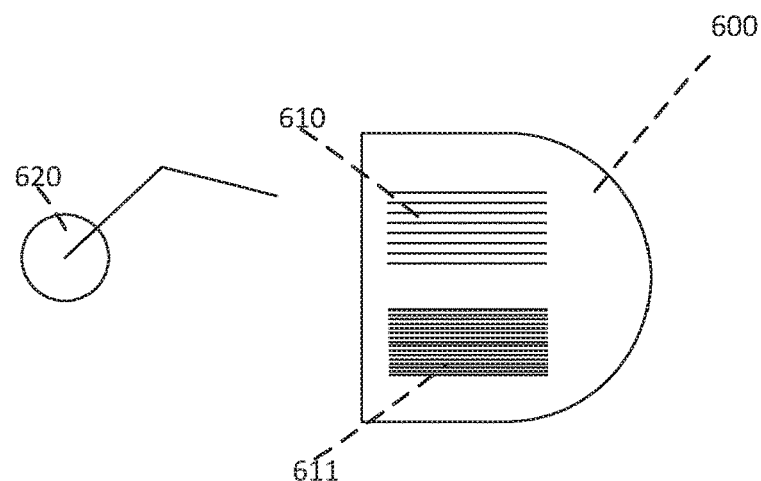
FIG. 6A is a component diagram of an embodiment of the present invention providing interchangeability between Tec-Cell structures and third party structures and systems.

FIG. 5C describes a third party container or larger container 500 such as a FOUP of which therein is any plurality of containers, of which may be different sizes or standards, such as container 502A, 502B or 502C wherein Tec-Cell carriers or rings may be of any size, shape, standard, etc. such as a size 501A, size 501B, or 501C, and wherein the sizes may be mismatched, matched or compatible with any size, third party container or FOUP, Tec-cell container, carrier, or otherwise FIG. 6A is a component diagram of an embodiment of the present invention providing interchangeability between Tec-Cell structures and third party structures and systems.

FIG. 6A describes a third party container or larger container 600 such as a FOUP of which therein is any plurality of Tec-Cell carriers or rings may be of any size, shape, standard, etc. and of which may be any such as a size or for instance may be in high density or low density configuration such as wherein 610 may be in low density configuration and 611 may be in high density configuration, and wherein may be stacked together or separately. Therein may also be at least one robot 620 which may access, the third party container or FOUP, containers, carriers or rings, or substrates or wafers.

Figure 6B:
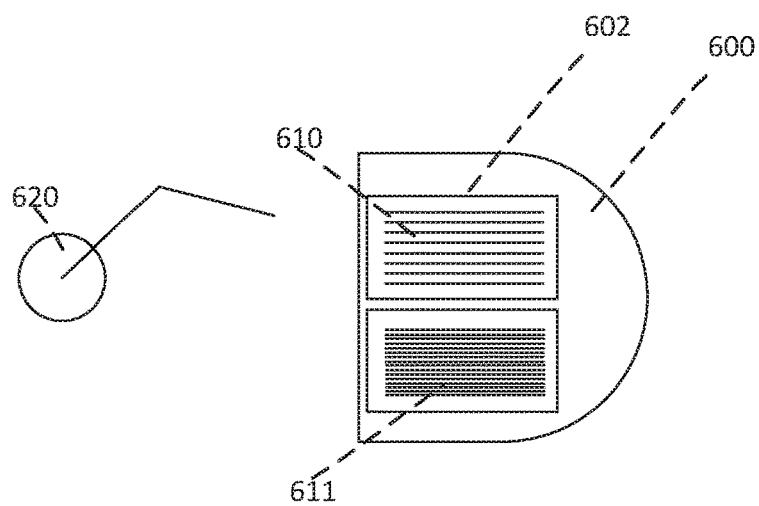
FIG. 6B is a component diagram of an embodiment of the present invention providing interchangeability between Tec-Cell structures and third party structures and systems.

FIG. 6B is a component diagram of an embodiment of the present invention providing interchangeability between Tec-Cell structures and third party structures and systems.

FIG. 6B describes a third party container or larger container 600 such as a FOUP of which therein is any plurality of Tec-Cell containers 602, and any plurality of Tec-Cell carriers or rings may be of any size, shape, standard, etc. and of which may be any such as a size or for instance may be in high density or low density configuration such as wherein 610 may be in low density configuration and 611 may be in high density configuration, and wherein may be stacked together or separately. Therein may also be at least one robot 620 which may access, the third party container or FOUP, containers, carriers or rings, or substrates or wafers.

Figure 6C:
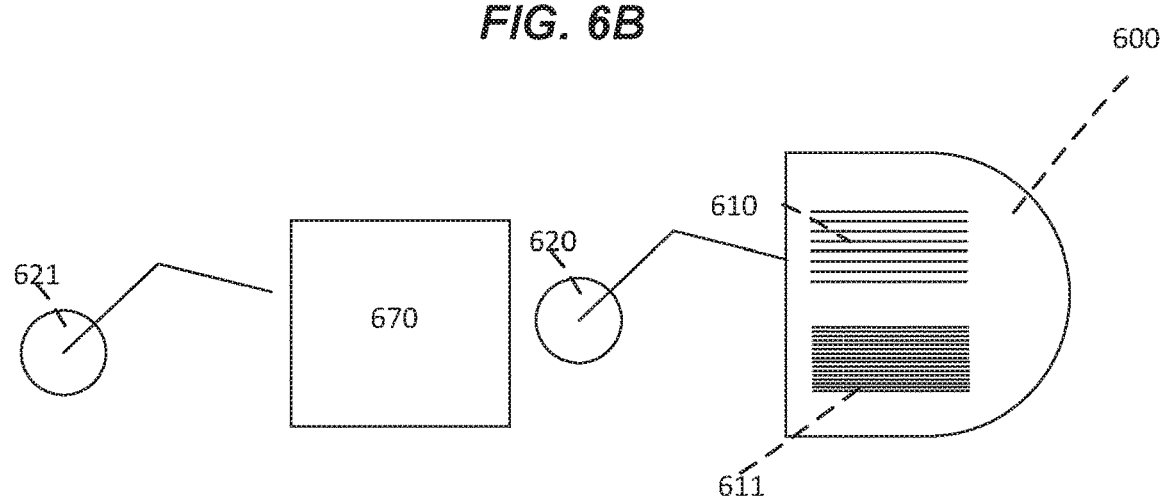
FIG. 6C is a component diagram of an embodiment of the present invention providing interchangeability between Tec-Cell structures and third party structures and systems

FIG. 6C is a component diagram of an embodiment of the present invention providing interchangeability between Tec-Cell structures and third party structures and systems.

FIG. 6C describes a third party container or larger container 600 such as a FOUP of which therein is any plurality of Tec-Cell carriers or rings may be of any size, shape, standard, etc. and of which may be any such as a size or for instance may be in high density or low density configuration such as wherein 610 may be in low density configuration and 611 may be in high density configuration, and wherein may be stacked together or separately. Therein may also be at least one robot 620 which may access, the third party container or FOUP, containers, carriers or rings, or substrates or wafers, and of which the robot or transfer mechanism may provide transportation to a system 670, of which may be a processing system, other station, storage, etc., of which may also include another robot or plurality of robot or transfer mechanisms 621.

Figure 7A:
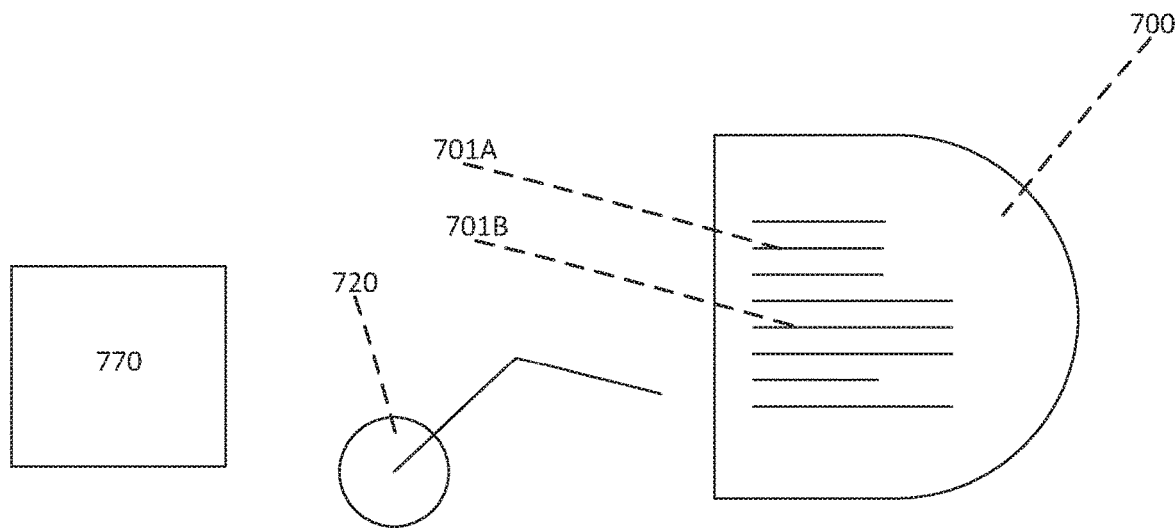
FIG. 7A is a component diagram of an embodiment of the present invention providing interchangeability between Tec-Cell structures and third party structures and systems.

FIG. 7A is a component diagram of an embodiment of the present invention providing interchangeability between Tec-Cell structures and third party structures and systems.

FIG. 7A describes a third party container or larger container 600 such as a FOUP of which therein is any plurality of Tec-Cell carriers or rings may be of any size, shape, standard, etc. and of which may be any such as a size or for instance may be in high density or low density configuration wherein the substrates may include different sizes or standards such as 701A and 701B, wherein therein may also be at least one robot 720 which may access, the third party container or FOUP, containers, carriers or rings, or substrates or wafers, and of which the robot or transfer mechanism may provide transportation to a system 770, of which may be a processing system, other station, storage, etc., of which wherein the single robot, with one effector, or different effectors may be able to effect the different size wafers, carriers, or substrates, etc. Additionally, the robot, or another robot, or station may provide ability for the wafers and carriers 701A and 701B to change between an open configuration and closed configuration, such as high and low density configurations.

Figure 7B:
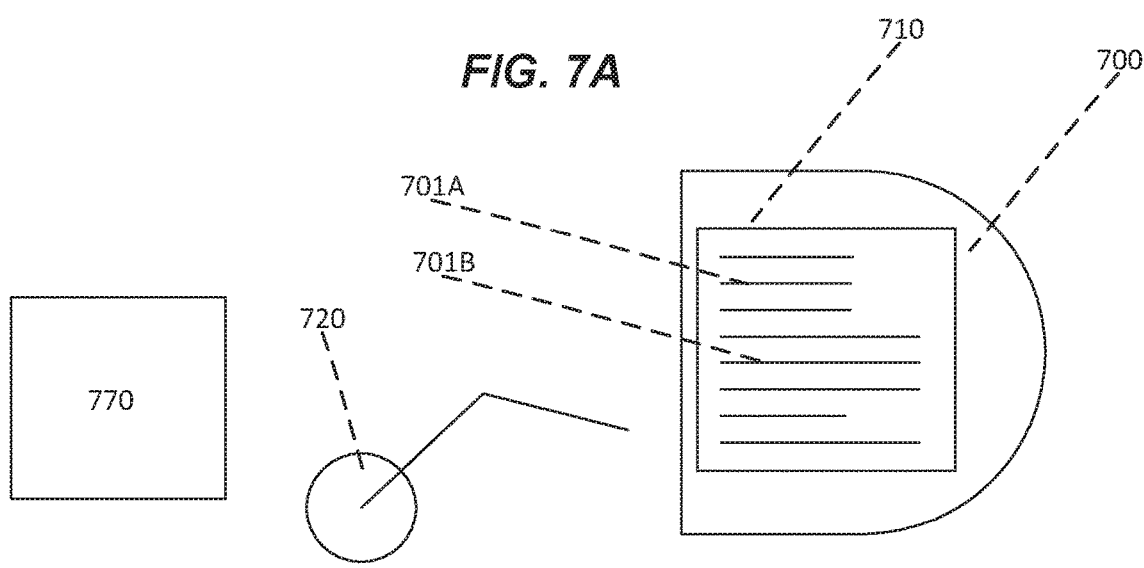
FIG. 7B is a component diagram of an embodiment of the present invention providing interchangeability between Tec-Cell structures and third party structures and systems.

FIG. 7B is a component diagram of an embodiment of the present invention providing interchangeability between Tec-Cell structures and third party structures and systems.

FIG. 7A describes a third party container or larger container 600 such as a FOUP of which therein is any plurality of containers 710 of which may house Tec-Cell carriers or rings may be of any size, shape, standard, etc. and of which may be any such as a size or for instance may be in high density or low density configuration wherein the substrates may include different sizes or standards such as 701A and 701B, wherein therein may also be at least one robot 720 which may access, the third party container or FOUP, containers, carriers or rings, or substrates or wafers, and of which the robot or transfer mechanism may provide transportation to a system 770, of which may be a processing system, other station, storage, etc., of which wherein the single robot, with one effector, or different effectors may be able to effect the different size wafers, carriers, or substrates, etc. Additionally, the robot, or another robot, or station may provide ability for the wafers and carriers 701A and 701B to change between an open configuration and closed configuration, such as high and low density configurations.

It is noted that the robot and effector may access the wafers or carriers within a container inside of the FOUP, such as opening the container inside of the FOUP, or may remove such as a holding station, or opener station such s to open the container.

Figure 8A:
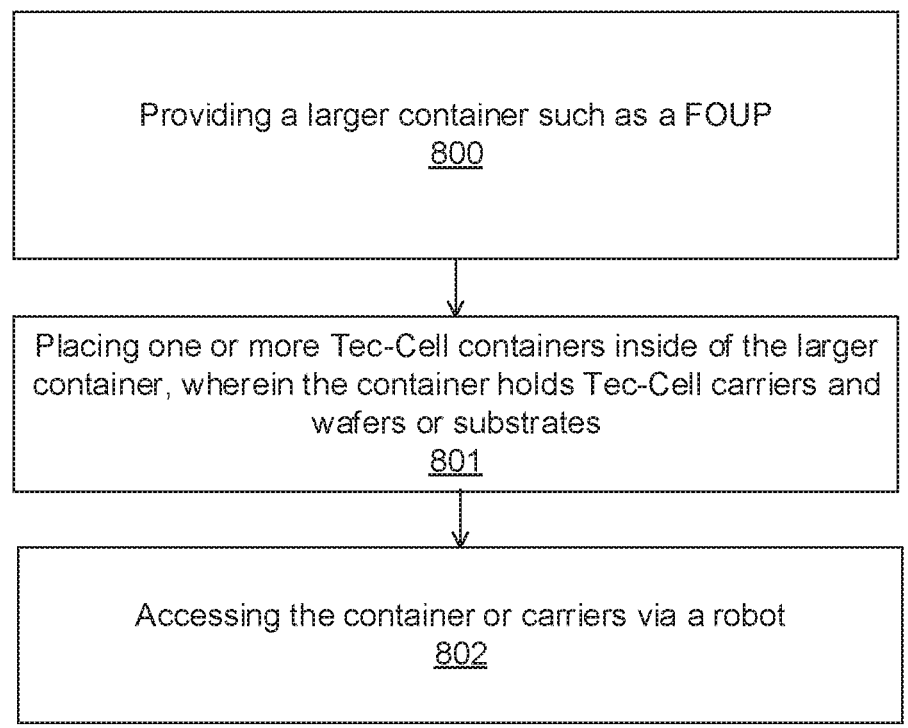
FIG. 8A is a flow chart diagram of an embodiment of the present invention providing interchangeability between Tec-Cell structures and third party structures and systems.

FIG. 8A is a flow chart diagram of an embodiment of the present invention providing interchangeability between Tec-Cell structures and third party structures and systems.

Figure 8B:
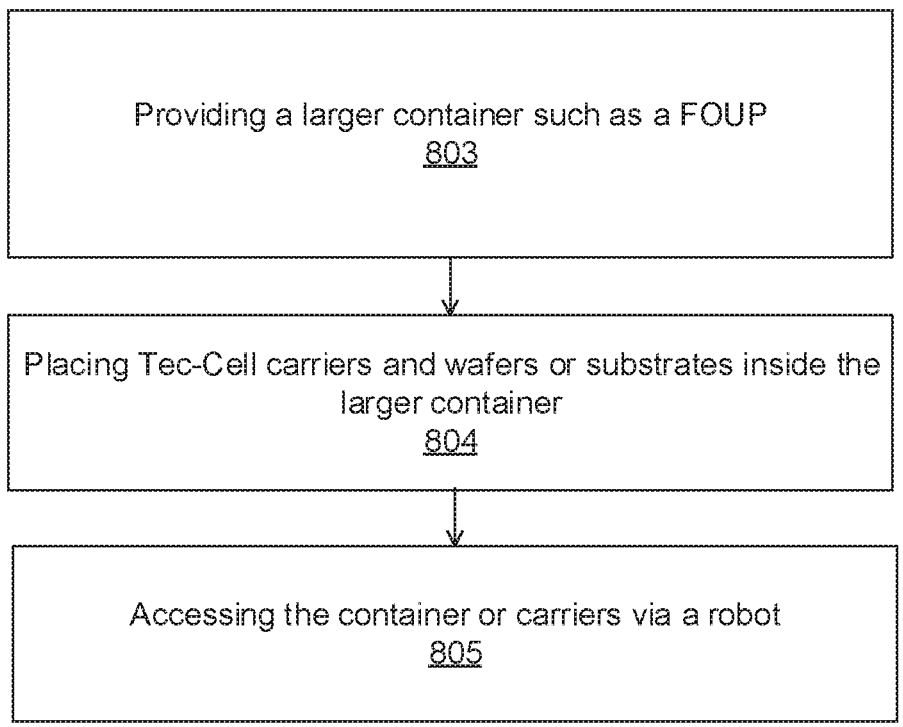
FIG. 8B is a flow chart diagram of an embodiment of the present invention providing interchangeability between Tec-Cell structures and third party structures and systems.

FIG. 8 describes at least Process 800 wherein at least Providing a larger container such as a FOUP, process 801 wherein at least placing one or more Tec-Cell containers inside of the larger container, wherein the container holds Tec-Cell carriers and wafers or substrates and process 802 wherein at least accessing the container or carriers via a robot FIG. 8B is a flow chart diagram of an embodiment of the present invention providing interchangeability between Tec-Cell structures and third party structures and systems.

FIG. 8B describes at least process 803 wherein at least providing a larger container such as a FOUP, process 804 wherein at least placing Tec-Cell carriers and wafers or substrates inside the larger container and process 805 wherein at least accessing the container or carriers via a robot.

Figure 9A:
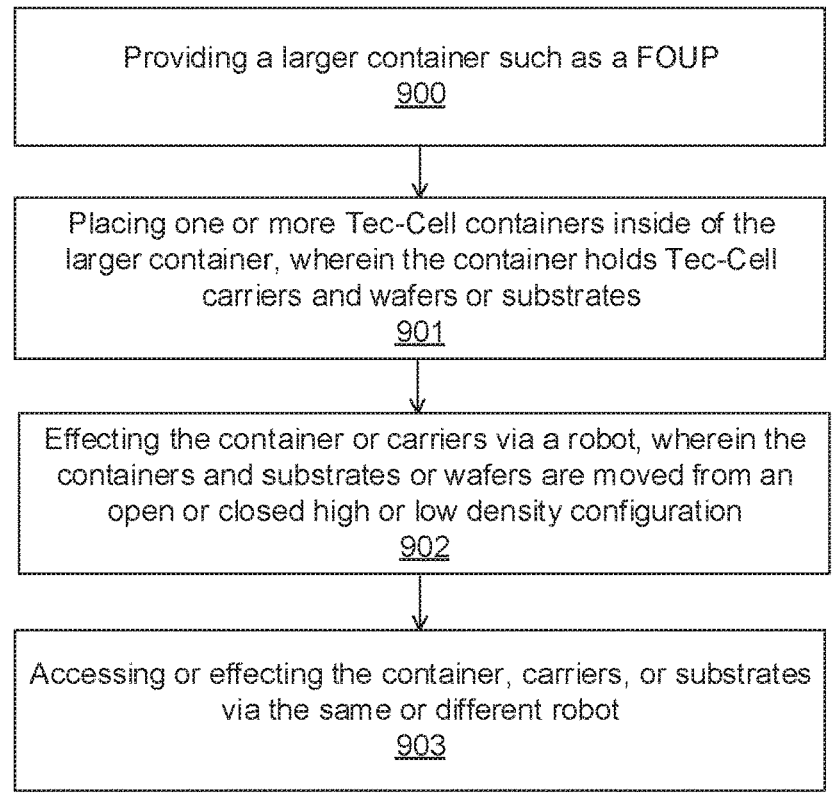
FIG. 9A is a flow chart diagram of an embodiment of the present invention providing interchangeability between Tec-Cell structures and third party structures and systems.

FIG. 9A is a flow chart diagram of an embodiment of the present invention providing interchangeability between Tec-Cell structures and third party structures and systems.

FIG. 9A describes at least process 900 wherein at least providing a larger container such as a FOUP, process 901 wherein at least Placing one or more Tec-Cell containers inside of the larger container, wherein the container holds Tec-Cell carriers and wafers or substrates, process 902 wherein at least effecting the container or carriers via a robot, wherein the containers and substrates or wafers are moved from an open or closed high or low density configuration, process 903 wherein at least accessing or effecting the container, carriers, or substrates via the same or different robot.

Figure 9B:
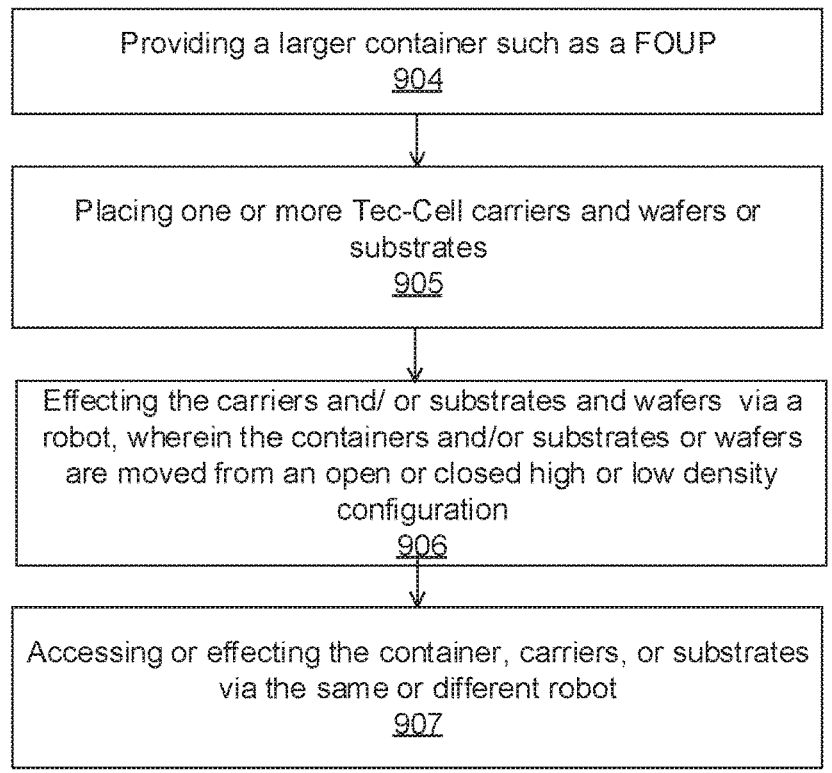
FIG. 9B is a flow chart diagram of an embodiment of the present invention providing interchangeability between Tec-Cell structures and third party structures and systems.

FIG. 9B is a flow chart diagram of an embodiment of the present invention providing interchangeability between Tec-Cell structures and third party structures and systems.

Figure 10:
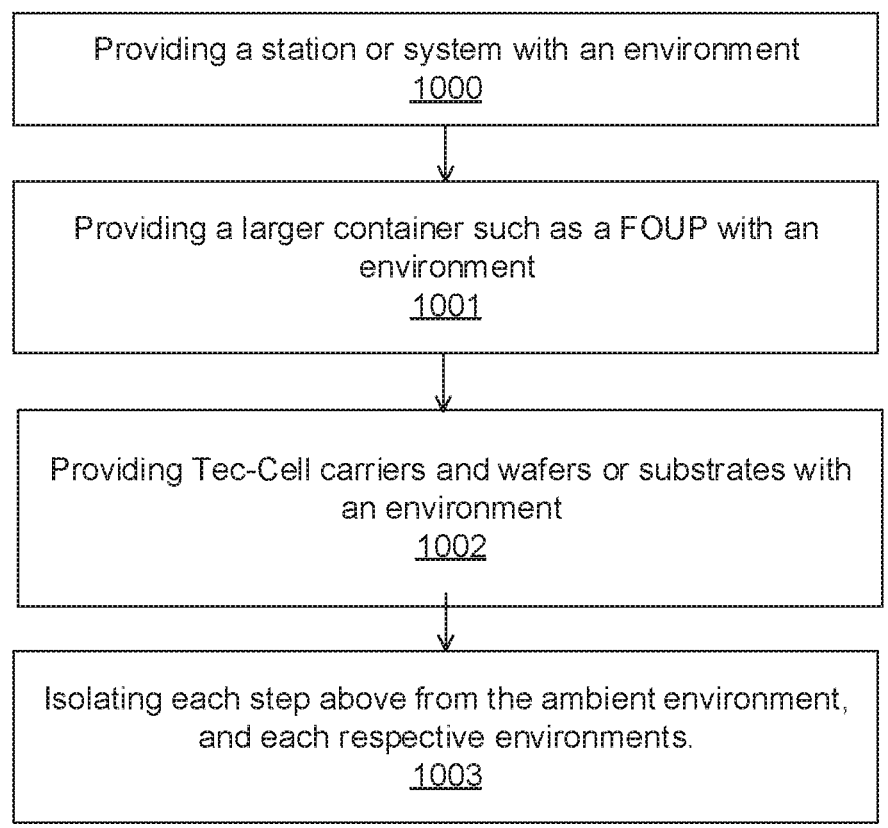
FIG. 10 is a flow chart diagram of an embodiment of the present invention providing interchangeability between Tec-Cell structures and third party structures and systems.

FIG. 9B describes at least process 904 wherein at least providing a larger container such as a FOUP, process 905 wherein at least process placing one or more Tec-Cell carriers and wafers or substrates, 906 wherein at least process effecting the carriers and/or substrates and wafers via a robot, wherein the containers and/or substrates or wafers are moved from an open or closed high or low density configuration 907 wherein at least accessing or effecting the container, carriers, or substrates via the same or different robot FIG. 10 is a flow chart diagram of an embodiment of the present invention providing interchangeability between Tec-Cell structures and third party structures and systems.

FIG. 10 describes at least process 1000 wherein at least providing a station or system with an environment, process 1001 wherein at least providing a larger container such as a FOUP with an environment, process 1002 wherein at least providing Tec-Cell carriers and wafers or substrates with an environment, process 1003 wherein at least isolating each step above from the ambient environment, and each respective environments.

Figure 11A:
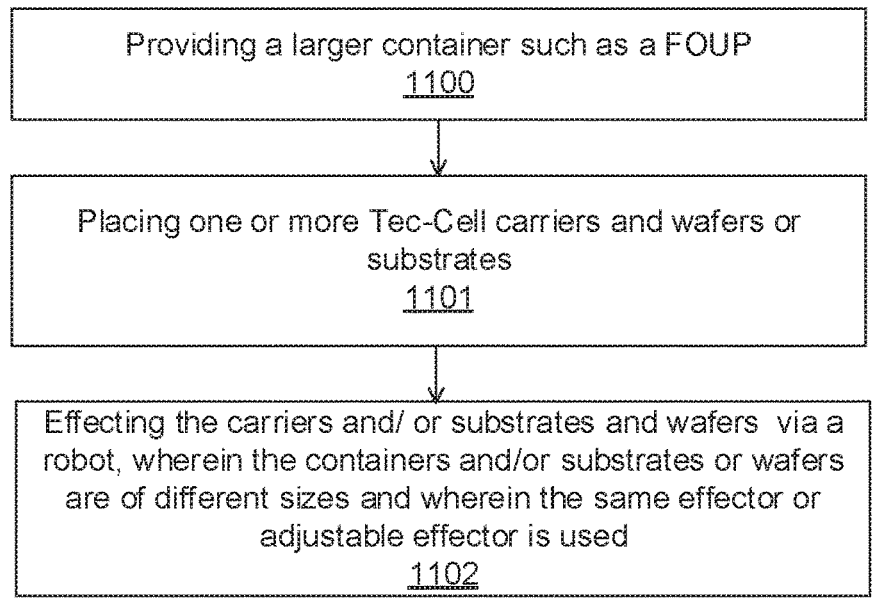
FIG. 11A is a flow chart diagram of an embodiment of the present invention providing interchangeability between Tec-Cell structures and third party structures and systems.

FIG. 11A is a flow chart diagram of an embodiment of the present invention providing interchangeability between Tec-Cell structures and third party structures and systems.

FIG. 11A describes at least process 1100 wherein at least providing a larger container such as a FOUP, at least process 1101 wherein at least placing one or more Tec-Cell carriers and wafers or substrates, at least process 1102 wherein at least effecting the carriers and/or substrates and wafers via a robot, wherein the containers and/or substrates or wafers are of different sizes and wherein the same effector or adjustable effector is used.

Figure 11B:
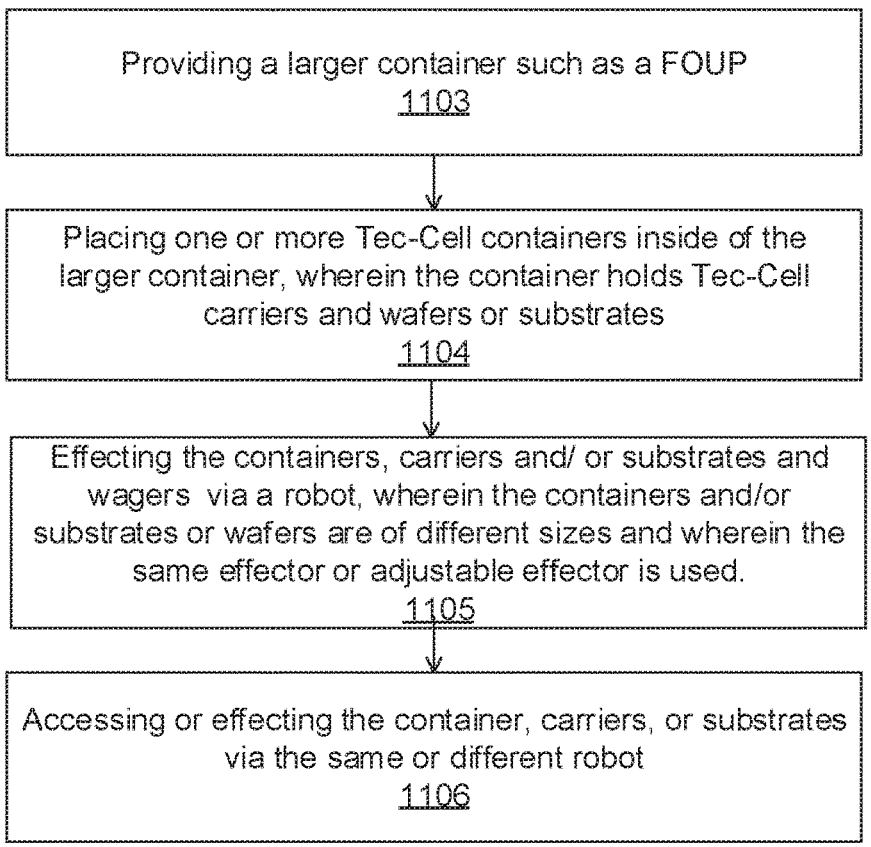
FIG. 11B is a flow chart diagram of an embodiment of the present invention providing interchangeability between Tec-Cell structures and third party structures and systems.

FIG. 11B is a flow chart diagram of an embodiment of the present invention providing interchangeability between Tec-Cell structures and third party structures and systems.

FIG. 11B describes at least process 1103 wherein at least providing a larger container such as a FOUP, at least process 1104 wherein at least placing one or more Tec-Cell containers inside of the larger container, wherein the container holds Tec-Cell carriers and wafers or substrates, at least process 1105 wherein at least effecting the containers, carriers and/or substrates and wagers via a robot, wherein the containers and/or substrates or wafers are of different sizes and wherein the same effector or adjustable effector is used, at least process 1106 wherein at least accessing or effecting the container, carriers, or substrates via the same or different robot.

Figure 12A:
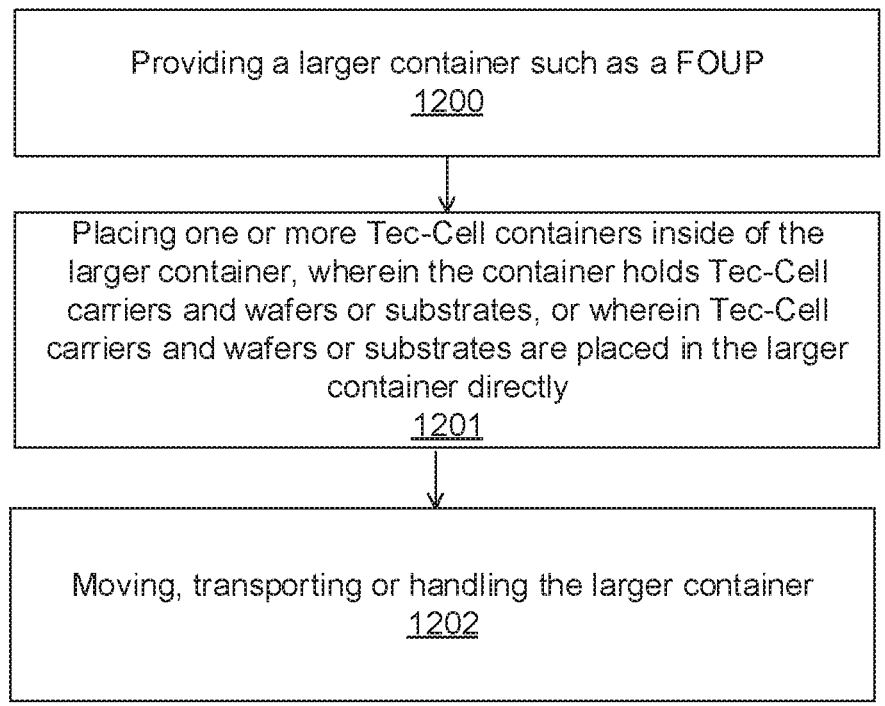
FIG. 12A is a flow chart diagram of an embodiment of the present invention providing interchangeability between Tec-Cell structures and third party structures and systems.

FIG. 12A is a flow chart diagram of an embodiment of the present invention providing interchangeability between Tec-Cell structures and third party structures and systems.

Figure 12B:
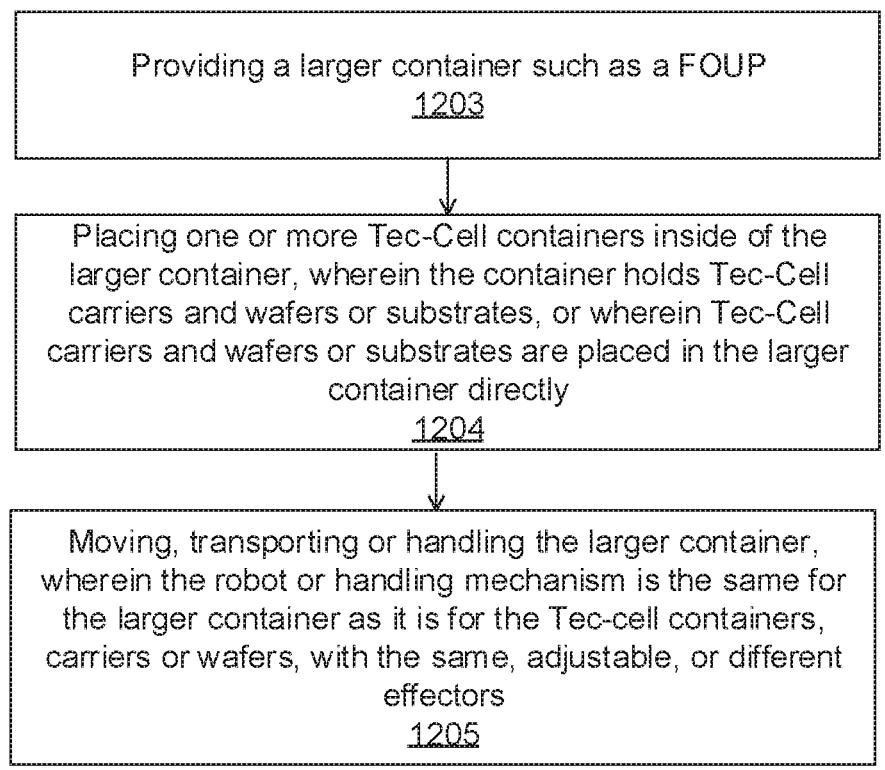
FIG. 12B is a flow chart diagram of an embodiment of the present invention providing interchangeability between Tec-Cell structures and third party structures and systems.

FIG. 12A describes at least process 1200 wherein at least providing a larger container such as a FOUP, process 1201 wherein at least placing one or more Tec-Cell containers inside of the larger container, wherein the container holds Tec-Cell carriers and wafers or substrates, or wherein Tec-Cell carriers and wafers or substrates are placed in the larger container directly, process 1202 wherein at least moving, transporting or handling the larger container FIG. 12B is a flow chart diagram of an embodiment of the present invention providing interchangeability between Tec-Cell structures and third party structures and systems.

FIG. 12B describes at least process 1203 wherein at least providing a larger container such as a FOUP, process 1204 wherein at least placing one or more Tec-Cell containers inside of the larger container, wherein the container holds Tec-Cell carriers and wafers or substrates, or wherein Tec-Cell carriers and wafers or substrates are placed in the larger container directly, process 1205 wherein at least moving, transporting or handling the larger container, wherein the robot or handling mechanism is the same for the larger container as it is for the Tec-cell containers, carriers or wafers, with the same, adjustable, or different effectors.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It is noted that the substrates or wafers throughout this disclosure may be a product wafer or substrate, such as an incomplete or complete semiconductor device or element, or a processing substrate such as a reticle or any other processing element which may be transported, handled, held or stored such as a reticle substrate, of which may be any type including photomasks for photolithography, EUV, or any other type. It is noted that the substrate, whether product or processing, may be provided different features and elements described depending on the type, and may be in any permeation or combination of the elements and features mentioned. It is also noted that the substrates, such as a reticle or processing elements may be captive in their own container, or may be bare in the larger containers, carriers and features and elements described. For instance a reticle substrate may be handled directly by the machinery and structures described herein or the reticle may be housed an integral or removable housing, wherein the housing and reticle together, or separately are handled by the machinery and structures described herein.

In addition, the modularity of the structures described herein may provide for ability to interchange between any type of substrate or wafer. This includes an interchange and modularity between substrates in their own containers, such as a bare reticle being held in an integral container or cartridge, wherein then the carriers, containers and structures described may interface, as well as interface with a bare product substrate as well for instance. This may be provided without changing carriers, may be able due to a carrier insert, or the carriers and structures may be adjustable or be provided with different holders. For instance there may be two or more different type carriers, that interface with the system as a whole, but the interior area of the carrier and structure may interface with a reticle type substrate, or a product type substrate and wherein the carrier is able to be processed or handled, but different carriers can hold different elements. In other embodiments, the carriers are the same and are interchangeable with different types of substrates for instance.

It may be appreciated that the various systems, methods, and apparatus disclosed herein may be embodied in a machine-readable medium and/or a machine accessible medium compatible with a data processing system (e.g., a computer system) and of which may be in any form including transitory, non-transitory or persistent data systems, as well as may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate manufacturing, storage, processing, or transfer system, comprising:
    a loading sub-system including a load port, wherein
    the load port transfers one or more elements to and from one or more exterior systems and one or more interior sub-systems, wherein
    the load port partially or completely isolates an interior of the system from an ambient environment;
    the one or more elements are one or more holders that hold one or more substrates;
    the load port is configured to accept any of Tec-Cell substrates, third party substrates, the one or more holders, and one or more containers without the load port being reconfigured;
    the load port includes a robot; and
    the robot readies the one or more holders and at least one of the one or more substrates to be accessed in batches or groups.

2. A system, as in claim 1, wherein:
    the system additionally accepts the one or more containers, and
    the one or more containers hold the one or more holders with the one or more substrates in a stack.

3. A system, as in claim 1, wherein:
    at least one of the one or more holders is a Tec-Cell holder, and
    the one or more holders are stackable;
    each of the one or more holders includes one or more holding arms that extend into a center interior recess of the holder;
    each of the one or more holders holds one of the one or more substrates via the holding arms;
    the one or more holders provide a separation between each of the one or more substrates when the one or more holders are stacked;
    each of the one or more is formed from one piece.

4. A system, as in claim 1, wherein:
    at least one of the one or more holders is a third party substrate holder.

5. A system, as in claim 2, wherein:
    the one or more holders are stacked in one of the one or more containers, which is a Tec-Cell container, and each of the one or more holders is able to be configured in a low density configuration or a high density configuration.

6. A system, as in claim 2, wherein:
    at least one of the one or more containers is a FOUP (Front Opening Unified Pod).

7. A system, as in claim 1, wherein:
    the robot transfers at least one of the one or more substrates to and from Tec-Cell holders and third party holders.

8. A system, as in claim 2, wherein:
    the robot transfers Tec-Cell holders to and from Tec-Cell containers and third party containers; and
    the third party containers include at least one FOUP.

9. A system, as in claim 2, wherein:
    the robot transfers third party holders to and from Tec-Cell containers and third-party containers; and
    the third party containers include at least one FOUP.

10. A system, as in claim 2, wherein:
    the robot configures the Tec-Cell container with at least one of the one or more holders and at least one of the one or more substrates to or from a high density configuration and low density configuration.

11. A system, as in claim 1, wherein:
    the load port readies at least one of the one or more substrates, the one or more holders, and the one or more containers to be accessed by a transport sub-system.

12. A system, as in claim 1, wherein:
    the batches or the groups are determined by a type of the one or more holders or a type of the at least one of the one or more substrates.

13. A system, as in claim 2, wherein:
    the robot readies the one or more holders or the at least one of the one or more substrates to be accessed depending on a type of the one or more containers.

14. A system, as in claim 1, wherein:
    the load port is OHT accessible.

15. A system, as in claim 2, wherein:
    the load port includes one or more effectors to manipulate the one or more substrates, the one or more holders, and the one or more containers.

16. A system, as in claim 15, wherein:
    the one or more effectors include a robot arm.

17. A system, as in claim 15, wherein:
    each of the one or more effectors is configured for a particular type of the one or more holders or a particular type of the one or more containers.

18. A system, as in claim 15, wherein:
    each of the one or more effectors includes an actively configurable effector end such that each effector is able to manipulate any type of substrate, holder, or container.

19. A system, as in claim 1, wherein:
    the one or more elements held are reticles instead of the one or more substrates.

* * * * *